US012701954B2

(12) United States Patent
Chen et al.

(10) Patent No.: US 12,701,954 B2
(45) Date of Patent: Aug. 4, 2026

(54) SYSTEM FOR STORING WAFER AND SYSTEM FOR MONITORING POLLUTION OF WAFER

(71) Applicant: FOXSEMICON INTEGRATED TECHNOLOGY, INC., Miao-Li Hsien (TW)

(72) Inventors: Chun-Chung Chen, Miaoli Hsien (TW); Yu-Wei Wu, New Taipei (TW); Chun-Kai Huang, Miaoli Hsien (TW); Tang-Yu Chang, Miaoli Hsien (TW)

(73) Assignee: FOXSEMICON INTEGRATED TECHNOLOGY, INC., Miao-Li Hsien (TW)

( * ) Notice: Subject to any disclaimer, the term of this patent is extended or adjusted under 35 U.S.C. 154(b) by 592 days.

(21) Appl. No.: 18/199,871

(22) Filed: May 19, 2023

(65) Prior Publication Data

US 2023/0377921 A1 Nov. 23, 2023

(30) Foreign Application Priority Data

May 19, 2022 (CN) .......................... 202210557191.6

(51) Int. Cl.
*H10P 72/00* (2026.01)
*H10P 72/10* (2026.01)

(52) U.S. Cl.
CPC ...... *H10P 72/0616* (2026.01); *H10P 72/0602* (2026.01); *H10P 72/1916* (2026.01);
(Continued)

(58) Field of Classification Search
CPC ............. H10P 72/0616; H10P 72/0602; H10P 72/1916; H10P 72/1918; H10P 72/1922;
(Continued)

(56) References Cited

U.S. PATENT DOCUMENTS

| 11,380,567 B2 * | 7/2022 | Yoon ................... | H10P 72/1926 |
| 2013/0174640 A1 * | 7/2013 | Oh ...................... | H10P 72/1924 |
| | | | 206/710 |

(Continued)

FOREIGN PATENT DOCUMENTS

| CN | 104563982 A | * | 4/2015 | ........... E21B 43/168 |
| JP | 2019176024 A | * | 10/2019 | .......... H10P 72/3404 |

(Continued)

*Primary Examiner* — Mohammed Shamsuzzaman
(74) *Attorney, Agent, or Firm* — ScienBiziP, P.C.

(57) ABSTRACT

A system for storing wafer is provided. The system includes a wafer box, an installing member, a detection tube, a control unit, and a detection unit. The wafer box includes an outlet connector and an inlet connector extending a wall of the wafer box. The installing member covers the wafer box to form a sealed receiving room. Two ends of the detection tube are coupled to the outlet connector and the inlet connector. The control unit are configured to output a first control signal to the detection unit. The detection unit includes a first sensor arranged in the detection tube. The first sensor is configured to detect a property of gas to obtain data of an environment where the wafer is stored upon the first control signal. A related system for monitoring pollution of wafer is also provided.

18 Claims, 4 Drawing Sheets

100

(52) U.S. Cl.
CPC ...... *H10P 72/1918* (2026.01); *H10P 72/1922*
(2026.01); *H10P 72/1926* (2026.01)

(58) Field of Classification Search
CPC ............. H10P 72/1926; H10P 72/0604; H10P
72/1924; H10P 72/0608; H10P 72/12;
G01D 21/02
See application file for complete search history.

(56) References Cited

U.S. PATENT DOCUMENTS

2019/0035658 A1 * 1/2019 Chiu .................. H10P 72/1924
2019/0139802 A1 * 5/2019 Chiu .................. H10P 72/1924

FOREIGN PATENT DOCUMENTS

| KR | 102173486 B1 * | 11/2020 | .......... H10P 72/3404 |
| KR | 102201151 B1 * | 1/2021 | .......... H10P 72/3408 |
| TW | 201910226 A | 3/2019 | |
| WO | WO-2019013506 A1 * | 1/2019 | .......... H10P 72/3411 |

* cited by examiner

1000

100

SYSTEM FOR STORING WAFER AND SYSTEM FOR MONITORING POLLUTION OF WAFER

FIELD

The subject matter herein generally relates to semiconductor processing technology, and particularly to a system for storing wafer and a system for monitoring pollution of wafer.

BACKGROUND

In a technology of semiconductor wafers with larger sizes, a wafer box can be commonly employed to store and transfer wafers, to prevent contaminants in the environment from dropping on the wafers in the wafer box. However, a common wafer box cannot monitor a state of trace gas and the like in the environment where the wafers are stored. As a constantly improvement of a processing technology, the trace gas and the like in the wafer box may cause defaults of the wafers and a lower yield of the wafers.

SUMMARY

An embodiment of the present application provides a system for storing wafer and a system for monitoring pollution of wafer which are capable of effectively monitoring the environment where the wafer is stored in the wafer box.

In a first aspect, an embodiment of the present application provides a system for storing wafer. The system for storing wafer includes a wafer box, an installing member, a detection tube, a control unit, and a detection unit. The wafer box is configured to store the wafer. The wafer box further includes an outlet connector and an inlet connector. The outlet connector and the inlet connector extend a wall of the wafer box from an inner of the wafer box to an outside of the wafer box. The installing member covers the wafer box to form a sealed receiving room between the wafer box and the installing member. The detection tube is received in the sealed receiving room. A first end of the detection tube is coupled to the outlet connector, and a second end of the detection tube is coupled to the inlet connector. The control unit is coupled to the detection unit. The control unit is outside the wafer box and received in the sealed receiving room. The control unit is configured to output a first control signal to the detection unit. The detection unit includes one or more first sensors. The one or more first sensors are arranged in the detection tube. The one or more first sensors are configured to detect one or more properties of gas in the wafer box to obtain data of an environment where the wafer is stored upon the first control signal.

According to some embodiments of the present application, the one or more first sensors are one of a temperature and humidity sensor, a volatile organic compound sensor, an oxygen concentration sensor, and any combination thereof.

According to some embodiments of the present application, the system for storing wafer further includes a storage unit and a wireless communication unit. The storage unit and the wireless communication unit are received in the sealed receiving room. The storage unit and the wireless communication unit are electrically coupled to the control unit. The storage unit is configured to store the data of the environment where the wafer is stored. The control unit is further configured to output a second control signal to the wireless communication unit. The wireless communication unit is configured to transmit the data of the environment where the wafer is stored to a database system.

According to some embodiments of the present application, the wafer box further defines a through hole. The detection unit further includes a second sensor and a detection wire. The second sensor is received in the wafer box. The second sensor is coupled to a first end of the detection wire, and a second end of the detection wire extends the through hole to couple to the control unit.

According to some embodiments of the present application, the second sensor is an air pressure sensor.

According to some embodiments of the present application, the detection unit further includes a third sensor. The third sensor is fixed in the sealed receiving room. The third sensor is an acceleration sensor. The third sensor is configured to detect an acceleration during a moving of the wafer box, to monitor whether the wafer box is suffered from an external impact.

According to some embodiments of the present application, the system for storing wafer further includes a display unit. The display unit appears on an outer surface of the installing member. The display unit is coupled to the control unit. The display unit is configured to display the data of the environment where the wafer is stored detected by the detection unit.

According to some embodiments of the present application, the system for storing wafer further includes an input unit. The input unit appears on an outer surface of the installing member. The input unit is coupled to the control unit. The input unit is configured to trigger the control unit to output the first control signal.

According to some embodiments of the present application, the wafer box further defines a first circulation passage and a second circulation passage. The first circulation passage is a gas outlet extending the wall of the wafer box from an inner of the wafer box. The second circulation passage is a gas inlet extending the wall of the wafer box from the inner of the wafer box. The system for storing wafer further includes a circulation tube and an air circulation unit. A first end of the circulation tube is coupled to the first circulation passage, and a second end of the circulation tube is coupled to the second circulation passage. The air circulation unit is arranged in the circulation tube and adjacent to the first circulation passage. The air circulation unit is configured to exhaust the gas from the wafer box via the first circulation passage and introduce the gas into the wafer box via the second circulation passage, to drive the gas in the wafer box to circulate.

In a second aspect, an embodiment of the present application provides a system for monitoring pollution of wafer. The system for monitoring pollution of wafer includes a database system, an electronic device, and a system for storing wafer. The system for storing wafer includes a wafer box, an installing member, a detection tube, a control unit, and a detection unit. The wafer box is configured to store the wafer. The wafer box further includes an outlet connector and an inlet connector. The outlet connector and the inlet connector extend a wall of the wafer box from an inner of the wafer box to an outside of the wafer box. The installing member covers the wafer box to form a seal receiving room between the wafer box and the installing member. The detection tube is received in the sealed receiving room. A first end of the detection tube is coupled to the outlet connector, and a second end of the detection tube is coupled to the inlet connector. The control unit is coupled to the detection unit. The control unit is outside the wafer box and received in the sealed receiving room. The control unit is configured to output a first control signal to the detection unit. The detection unit includes one or more first sensors. The one or more first sensors are arranged in the detection tube. The one or more first sensors are configured to detect a state of gas in the wafer box to obtain data of an environment where the wafer is stored upon the first control signal. The system for storing wafer is further configured to transmit the data of the environment where the wafer is stored to the database system. The database system is configured to receive the data of the environment where the wafer is stored from the system for storing wafer. The electronic device is communicationally coupled to the database system. The electronic device is configured to view and invoke the data of the environment where the wafer is stored remotely.

Comparing to a nowadays technology, the disclosure has the following beneficial effects:

In the disclosure, a detection unit, a detection tube, a control unit, and an installing member are added to a wafer box, thus the disclosure can effectively monitor the environment where the wafer is stored, to obtain the data of the environment where the wafer is stored.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

In order to more clearly understand the above objects, features and advantages of the present application, the following detailed description of present application will be made with reference to the accompanying drawings and specific implementations. It should be noted that implementations and characteristics thereof in the present application can be combined mutually in the case of no conflict. Many specific details are described in the following description to fully understand the present application, but described implementations are merely a portion of implementations of present invention, rather than all of the implementations.

Unless otherwise defined, all technical and scientific terms used herein have the same meaning as commonly understood by one ordinarily skilled in the art to which the present disclosure pertains. In the present disclosure, the terms used in the description is for the purpose of describing the specific embodiments, but not intended to limit the present disclosure. As used herein, the term "and/or," includes any and all combinations of one or more of the associated listed items.

The term "connected" is defined as connected, whether directly or indirectly through intervening components, and is not necessarily limited to physical connections. As used herein, terms 'up', "down", "above", "below", "left", "right", and similar expressions are only for illustrative purposes.

Figure 1:
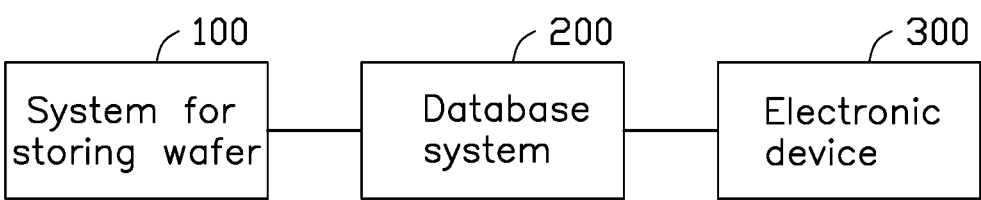
FIG. 1 is a view of an embodiment showing a system for monitoring pollution of wafer.

Referring to FIG. 1, a system for monitoring pollution of wafer 1000 is shown. The system for monitoring pollution of wafer 1000 includes a system for storing wafer 100, a database system 200, and an electronic device 300.

The system for storing wafer 100 is communicationally coupled to the database system 200. The system for storing wafer 100 is configured to store the wafer and monitor an environment where the wafer is stored, to obtain data of the environment where the wafer is stored. The system for storing wafer 100 is further configured to transmit the data of the environment where the wafer is stored to the database system 200. The data of the environment where the wafer is stored includes, but is not limited to, a temperature of gas in a wafer box, a humidity of the gas in the wafer box, an air pressure of the gas in the wafer box, oxygen concentration in the wafer box, volatile organic compounds in the wafer box, and the like.

The data of the environment where the wafer is stored monitored by the system for storing wafer 100 is transmitted to the database system 200.

The database system 200 is configured to receive and save the data of the environment where the wafer is stored from the system for storing wafer 100. In some embodiments, the database system 200 is further configured to save the yield data of the wafer stored by the system for storing wafer 100. It can be understood that, the database system 200 can include a server.

The electronic device 300 is communicationally coupled to the database system 200. In some embodiments, the electronic device 300 can view and invoke the data of the environment where the wafer is stored monitored by the system for storing wafer 100. The electronic device 300 can be a personal computer, a table personal computer, a smart phone, a personal digital assistant, and the like, and the disclosure is not limited herein.

It can be understood that, the electronic device 300 can analyze the yield of the wafer according to the data of the environment where the wafer is stored monitored by the system for storing wafer 100 and the yield data of the wafer. Thus, one or more factors influencing the yield of the wafer are obtained. Thus, the yield of the wafer can improved according to the one or more factors.

It can be understood that, there may be a number of systems for storing wafer in the system for monitoring pollution of wafer 1000, the disclosure is not limited herein.

Figure 2:
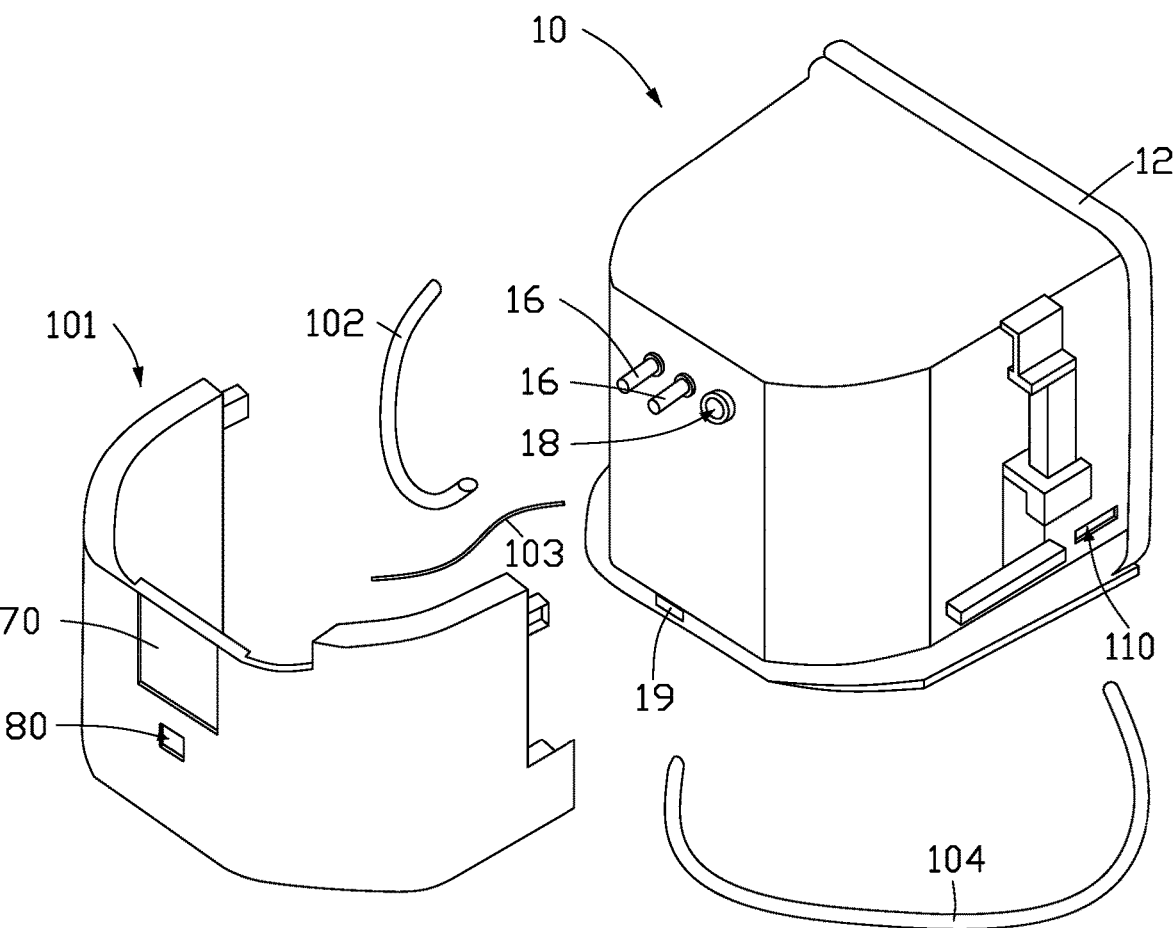
FIG. 2 is a schematic view of an embodiment showing a system for storing wafer.
Figure 3:
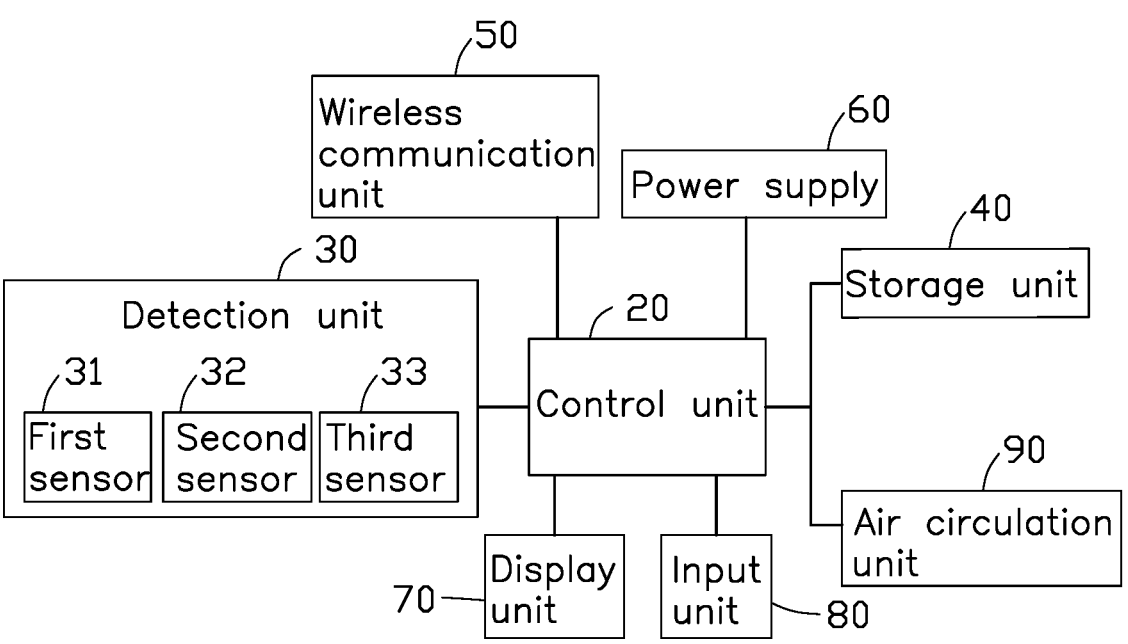
FIG. 3 is a block diagram of an embodiment showing a system for storing wafer.

Referring to FIGS. 2-3, the system for storing wafer 100 includes a wafer box 10, an installing member 101, a control unit 20, a detection unit 30, a storage unit 40, a wireless communication unit 50, a power supply 60, a display unit 70, and an input unit 80.

Figure 4:
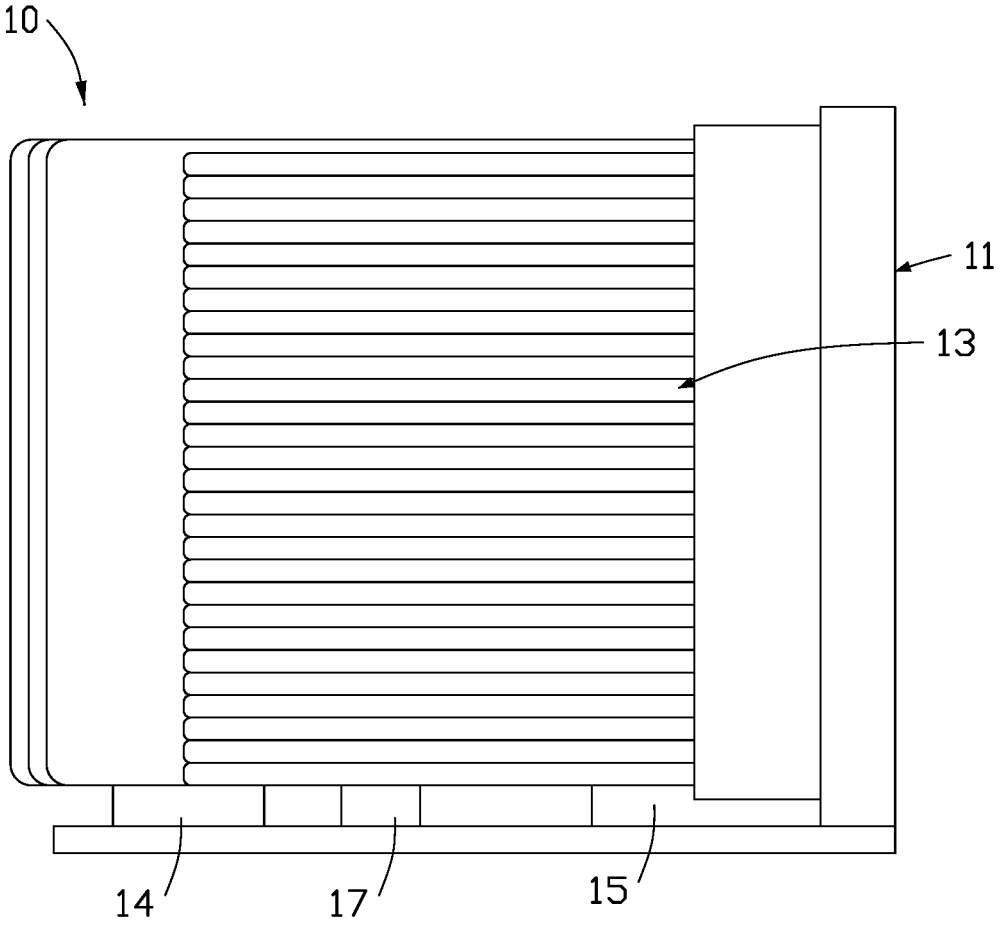
FIG. 4 is a side view of an embodiment showing a wafer box.

Referring also to FIG. 4, the wafer box 10 is configured to hold the wafer securely and safely in a controlled environment. The wafer box 10 defines an open 11. The wafer box 10 further includes a moveable door 12. The moveable door 12 is arranged in the open 11. The moveable door 12 can be open by some devices or an operator. Thus, the wafer held in the wafer box 10 can be took out via the open 11, or the wafer can be held in the wafer box 10 via the open 11. A number of receiving grooves 13 are defined in the wafer box 10. Each receiving groove 13 is configured to receive and hold one wafer. In some embodiments, the receiving grooves 13 are stacked arranged in the wafer box 10 along a vertical direction of the wafer box 10.

A bottom of the wafer box 10 further defines an inlet opening 14 and an outlet opening 15. The inlet opening 14 and the outlet opening 15 are respectively configured to cooperate with an air charging device and an air extracting device to exchange the air in the wafer box 10. For example, the air charging device can introduce inert gas into the wafer box 10 via the inlet opening 14, and the air extracting device can exhaust the gas from the wafer box 10 via the outlet opening 15. Thus, the air charging device and the air extracting device can exchange the gas in the wafer box 10, therefore the moisture, the oxygen, and the like in the wafer box 10 can be cleared up, and the stored time of the wafer in the wafer box 10 can be longer.

The wafer box 10 further includes an outlet connector 16 and an inlet connector 17. The outlet connector 16 and the inlet connector 17 extend a wall of the wafer box 10 from an inner of the wafer box 10 to an outside of the wafer box 10. The outlet connector 16 is arranged in a sidewall of the wafer box 10. The inlet connector 17, for example, is arranged in the bottom of the wafer box 10. The system for storing wafer 100 further includes a detection tube 102. A first end of the detection tube 102 is coupled to the outlet connector 16, and a second end of the detection tube 102 is coupled to the inlet connector 17. The gas can be flow out to the detection tube 102 from the wafer box 10 via the outlet connector 16, and flow into the wafer box 10 from the detection tube 102 via the inlet connector 17. In some embodiments, the wafer box 10 further define a through hole 18. The through hole 18, for example, is defined in the sidewall of the wafer box 10.

In some embodiments, the control unit 20, the storage unit 40, the wireless communication unit 50, the power supply 60, the display unit 70, and the input unit 80 are all arranged on the installing member 101.

In some embodiments, the installing member 101 covers the wafer box 10 to form a sealed receiving room between the wafer box 10 and the installing member 101. The control unit 20, the storage unit 40, the wireless communication unit 50, and the power supply 60 are fixed in the sealed receiving room. In some embodiments, the shape of the installing member 101 matches with the shape of the surface of the wafer box 10 away from the moveable door 12. The installing member 101 covers the wafer box 10 at the surface of the wafer box 10 away from the moveable door 12.

The power supply 60 is configured to provide power for the control unit 20, the detection unit 30, the storage unit 40, the wireless communication unit 50, the display unit 70, and the input unit 80. The power supply 60 can include a battery and a power supply control board. The power supply control board is configured to control a charge of the battery, a discharge of the battery, a power consumption management, and the like.

The detection unit 30 includes one or more first sensors 31, a second sensor 32, and a third sensor 33. The data detected by the detection unit 30 is the data of the environment where the wafer is stored.

The one or more first sensors 31 are arranged in the detection tube 102. The one or more first sensors 31 are configured to detect one or more properties of the gas exhausted from the wafer box 10. Thus, the one or more properties of the gas inside the wafer box 10 can be indirectly detected. In some embodiments, the one or more first sensors 31, for example, can be a temperature and humidity sensor. The temperature and humidity sensor is configured to detect the temperature and the humidity of the gas exhausted from the wafer box 10. In some embodiments, the one or more first sensors 31 can be a volatile organic compound sensor. The volatile organic compound sensor is configured to detect the volatile organic compounds of the gas exhausted from the wafer box 10, for example formaldehyde, toluene, and the like. In some embodiments, the one or more first sensors 31 is an oxygen concentration sensor. The oxygen concentration sensor is configured to detect oxygen concentration of the gas exhausted from the wafer box 10. It can be understood that, a detail type and the number of the first sensors 31 is not limited herein, the first sensors 31 can be the sensors detecting the other property of the gas, and the number of the first sensors 31 can be vary according to the need.

In some embodiments, the one or more first sensors 31 are electrically coupled to the control unit 20. For example, the one or more first sensors 31 are coupled to the control unit 20 via wires. It can be understood that, the one or more first sensors 31 can be coupled to the control unit 20 via the other manner, for example, via a wireless manner.

The second sensor 32 is arranged inside the wafer box 10. The second sensor 32 is configured to directly detect the property of the gas inside the wafer box 10. In some embodiments, the system for storing wafer 100 further includes a detection wire 103. The second sensor 32 is coupled to a first end of the detection wire 103, and a second end of the detection wire 103 extends the through hole 18 to electrically couple to the control unit 20. In some embodiments, the second sensor 32 can be an air pressure sensor. The air pressure sensor can be configured to detect the pressure of the gas inside the wafer box 10. It can be understood that, the second sensor 32 is arranged inside the wafer box 10, thus the pressure of the gas inside the wafer box 10 can be accurately detected.

The third sensor 33 is fixed in the sealed receiving room. In some embodiments, the third sensor 33 can be an acceleration sensor. The third sensor 33 is configured to detect an acceleration during a moving of the wafer box 10, to monitor whether the wafer box 10 is suffered from an external impact. It can be understood that, if the wafer box 10 is suffered from the external impact, there may exist a condition that the wafer in the wafer box 10 is damaged.

The storage unit 40 may be configured to store computer program instruction and various data. The storage unit 40 mainly includes a program storage area and a data storage area. The program storage area may store an operating system, control program, and computer program instruction, such as a text editor. The data storage area may store data created according to use of the system for storing wafer 100, and the like. The storage unit 40 can include a high-speed random access memory and a non-transitory storage medium, such as a disk storage device, a flash memory, or other transitory storage medium.

The wireless communication unit 50 is configured to transmit a signal to the database system 200. The wireless communication unit 50, for example, can includes a WiFi module, a 4G module, a 5G module, a Bluetooth module, or the like. The wireless communication unit 50 is configured to transmit the data of the environment where the wafer is stored which is stored in the storage unit 40 to the database system 200.

The control unit 20 is a control center of the system for storing wafer 100. Various parts of the system for storing wafer 100 are electrically connected to the control unit 20. The control unit 20 can output a first control signal to the detection unit 30. The detection unit 30 (for example the one or more first sensors 31, and the like) can detect the environment where the wafer is stored in the wafer box 10 upon the first control signal, to obtain the data of the environment where the wafer is stored. For example, the detection unit 30 detects the temperature and the humidity inside the wafer box 10, detects the volatile organic compounds inside the wafer box 10, and the like. The control unit 20 can further output a second control signal to the wireless communication unit 50. The wireless communication unit 50 can transmit the data of the environment where the wafer is stored to an external device upon the second control signal, for example, transmit the data of the environment where the wafer is stored to the database system 200.

The display unit 70 appears on an outer surface of the installing member 101. The display unit 70 is coupled to the control unit 20. The display unit 70 is configured to display the data of the environment where the wafer is stored detected by the detection unit 30. The display unit 70 can include a display panel. Where, the display panel can be a liquid crystal display (LCD), an organic light-emitting diode (OLED), or the like.

In some embodiments, the display unit 70 can be configured to display a sampling information by the detection unit 30, for example, a sampling frequency of the gas, a sampling time interval, and the like.

The input unit 80 can be configured to receive inputted digital information or character information. In some embodiments, the input unit 80 can be one or more physical keys. In some embodiments, the input unit 80 can be configured to trigger the control unit 20 to output the first control signal, to control the detection unit 30 to detect. In some embodiments, the input unit 80 can be configured to trigger the control unit 20 to output the second control signal, to control the wireless communication unit 50 to transmit the data of the environment where the wafer is stored in the storage unit 40 to the database system 200. In some embodiments, the user can switch the display interface on the display unit 70 by the input unit 80, for example, switching the display interface from an interface displaying the data detected by the one or more first sensors 31 to an interface displaying the data detected by the second sensor 32, and the like.

It can be understood that, the input unit 80 can be a touch panel, also referred to as a touch screen. The input unit 80 can collect touch operations (for example, operations on the touch pane or in the vicinity of the touch panel which are performed by the user through any suitable object or accessory such as a palm or a finger) thereon or in the vicinity thereof, and drive a corresponding connection device according to a preset program.

In some embodiments, the system for storing wafer 100 can further include an air circulation unit 90 and a circulation tube 104. The air circulation unit 90 is coupled to the control unit 20. The air circulation unit 90 is configured to drive the gas in the wafer box 10 to circulate under a control of the control unit 20. The wafer box 10 further defines a first circulation passage 19 and a second circulation passage 110 at a side of the wafer box 10 which is adjacent to and corresponding to the installing member 101. The first circulation passage 19 is a gas outlet extending the wall of the wafer box 10. The second circulation passage 110 is a gas inlet extending the wall of the wafer box 10 from the inner of the wafer box 10. A first end of the circulation tube 104 is coupled to the first circulation passage 19, and a second end of the circulation tube 104 is coupled to the second circulation passage 110. The air circulation unit 90 is received in the circulation tube 104, and is adjacent to the first circulation passage 19.

In some embodiments, the air circulation unit 90 can be a fan. The fan is configured to exhaust the gas from the wafer box 10 via the first circulation passage 19 and introduce the gas into the wafer box 10 via the second circulation passage 110, to drive the gas in the wafer box 10 to circulate. In some embodiments, the air circulation unit 90 can be a pump.

It can be understood that, in some embodiments, the air circulation unit 90 can be omitted. In some embodiments, the gas in the wafer box 10 can be circulated under natural diffusion.

In the disclosure, the detection unit 30, the detection tube 102, the control unit 20, and the installing member 101 are added to the wafer box 10, thus the disclosure can effectively monitor the environment where the wafer is stored during storing the wafer, to obtain the data of the environment where the wafer is stored.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. A system for storing wafer comprising a wafer box, an installing member, a detection tube, a control unit, a detection unit, a circulation tube and an air circulation unit;

the wafer box configured to store the wafer, the wafer box comprising an outlet connector and an inlet connector, the outlet connector and the inlet connector extending a wall of the wafer box from an inner of the wafer box to an outside of the wafer box;

the installing member covering the wafer box to form a sealed receiving room between the wafer box and the installing member;

the detection tube received in the sealed receiving room, a first end of the detection tube being coupled to the outlet connector, and a second end of the detection tube being coupled to the inlet connector; the control unit coupled to the detection unit, the control unit being outside the wafer box and received in the sealed receiving room, the control unit being configured to output a first control signal to the detection unit;

the detection unit comprising one or more first sensors, the one or more first sensors being arranged in the detection tube, the one or more first sensors being configured to detect one or more properties of gas in the detection tube to obtain data of an environment where the wafer is stored upon the first control signal;

the wafer box further defines a through hole, the detection unit further comprises a second sensor and a detection wire, the second sensor is received in the wafer box, the second sensor is coupled to a first end of the detection wire, and a second end of the detection wire extends the through hole to couple to the control unit, the second sensor is an air pressure sensor;

the wafer box further defines a first circulation passage and a second circulation passage, a first end of the circulation tube is coupled to the first circulation passage, and a second end of the circulation tube is coupled to the second circulation passage;

the detection unit further comprises a third sensor, the third sensor is fixed in the sealed receiving room, the third sensor is an acceleration sensor.

2. The system for storing wafer according to claim 1, wherein:

the one or more first sensors are one of a temperature and humidity sensor, a volatile organic compound sensor, an oxygen concentration sensor, and any combination thereof.

3. The system for storing wafer according to claim 1, wherein:

the system for storing wafer further comprises a storage unit and a wireless communication unit, the storage unit and the wireless communication unit are received in the sealed receiving room, the storage unit and the wireless communication unit are electrically coupled to the control unit;

the storage unit is configured to store the data of the environment where the wafer is stored;

the control unit is further configured to output a second control signal to the wireless communication unit, and the wireless communication unit is configured to transmit the data of the environment where the wafer is stored to a database system.

4. The system for storing wafer according to claim 1, wherein:

the air pressure sensor is configured to detect a pressure of the gas inside the wafer box.

5. The system for storing wafer according to claim 1, wherein:

the third sensor is configured to detect an acceleration during a moving of the wafer box, to monitor whether the wafer box is suffered from an external impact.

6. The system for storing wafer according to claim 1, wherein:

the system for storing wafer further comprises a display unit, the display unit appears on an outer surface of the installing member, the display unit is coupled to the control unit, and the display unit is configured to display the data of the environment where the wafer is stored detected by the detection unit.

7. The system for storing wafer according to claim 1, wherein:

the system for storing wafer further comprises an input unit, the input unit appears on an outer surface of the installing member, the input unit is coupled to the control unit, and the input unit is configured to trigger the control unit to output the first control signal.

8. The system for storing wafer according to claim 1, wherein:

the first circulation passage is a gas outlet extending the wall of the wafer box from the inner of the wafer box, and the second circulation passage is a gas inlet extending the wall of the wafer box from the inner of the wafer box;

the air circulation unit is arranged in the circulation tube and adjacent to the first circulation passage, the air circulation unit is configured to exhaust the gas from the wafer box via the first circulation passage and introduce the gas into the wafer box via the second circulation passage, to drive the gas in the wafer box to circulate.

9. The system for storing wafer according to claim 1, wherein:

the wafer box defines an open, the wafer box further comprises a moveable door, and the moveable door is arranged in the open;

the shape of the installing member matches with the shape of the surface of the wafer box away from the moveable door, and the installing member covers the wafer box at the surface of the wafer box away from the moveable door.

10. A system for monitoring pollution of wafer comprising a database system, an electronic device, and a system for storing wafer; the system for storing wafer comprising a wafer box, an installing member, a detection tube, a control unit, and a detection unit, a circulation tube and an air circulation unit;

the wafer box configured to store the wafer, the wafer box comprising an outlet connector and an inlet connector, the outlet connector and the inlet connector extending a wall of the wafer box from an inner of the wafer box to an outside of the wafer box;

the installing member covering the wafer box to form a sealed receiving room between the wafer box and the installing member; the detection tube received in the sealed receiving room, a first end of the detection tube being coupled to the outlet connector, and a second end of the detection tube being coupled to the inlet connector;

the control unit coupled to the detection unit, the control unit being outside the wafer box and received in the sealed receiving room, the control unit being configured to output a first control signal to the detection unit;

the detection unit comprising one or more first sensors, the one or more first sensors being arranged in the detection tube, the one or more first sensors being configured to detect one or more properties of gas in the detection tube to obtain data of an environment where the wafer is stored upon the first control signal;

the wafer box further defines a through hole, the detection unit further comprises a second sensor and a detection wire, the second sensor is received in the wafer box, the second sensor is coupled to a first end of the detection wire, and a second end of the detection wire extends the through hole to couple to the control unit, the second sensor is an air pressure sensor;

the wafer box further defines a first circulation passage and a second circulation passage, a first end of the circulation tube is coupled to the first circulation passage, and a second end of the circulation tube is coupled to the second circulation passage;

the detection unit further comprises a third sensor, the third sensor is fixed in the sealed receiving room, the third sensor is an acceleration sensor;

the system for storing wafer configured to transmit the data of the environment where the wafer is stored to the database system; the database system configured to receive the data of the environment where the wafer is stored from the system for storing wafer;

the electronic device communicationally coupled to the database system, the electronic device being configured to view and invoke the data of the environment where the wafer is stored remotely.

11. The system for monitoring pollution of wafer according to claim 10, wherein:

the one or more first sensors are one of a temperature and humidity sensor, a volatile organic compound sensor, an oxygen concentration sensor, and any combination thereof.

12. The system for monitoring pollution of wafer according to claim 10, wherein:

the system for storing wafer further comprises a storage unit and a wireless communication unit, the storage unit and the wireless communication unit are received in the sealed receiving room, the storage unit and the wireless communication unit are electrically coupled to the control unit;

the storage unit is configured to store the data of the environment where the wafer is stored;

the control unit is further configured to output a second control signal to the wireless communication unit, and the wireless communication unit is configured to transmit the data of the environment where the wafer is stored to the database system.

13. The system for storing wafer according to claim 10, wherein:

the air pressure sensor is configured to detect a pressure of the gas inside the wafer box.

14. The system for monitoring pollution of wafer according to claim 10, wherein:

the third sensor is configured to detect an acceleration during a moving of the wafer box, to monitor whether the wafer box is suffered from an external impact.

15. The system for monitoring pollution of wafer according to claim 10, wherein:

the system for storing wafer further comprises a display unit, the display unit appears on an outer surface of the installing member, the display unit is coupled to the control unit, and the display unit is configured to display the data of the enVironment where the wafer is stored detected by the detection unit.

16. The system for monitoring pollution of wafer according to claim 11, wherein:

the system for storing wafer further comprises an input unit, the input unit appears on an outer surface of the installing member, the input unit is coupled to the control unit, and the input unit is configured to trigger the control unit to output the first control signal.

17. The system for monitoring pollution of wafer according to claim 10, wherein:

the first circulation passage is a gas outlet extending the wall of the wafer box from the inner of the wafer box, and the second circulation passage is a gas inlet extending the wall of the wafer box from the inner of the wafer box;

the air circulation unit is arranged in the circulation tube and adjacent to the first circulation passage, the air circulation unit is configured to exhaust the gas from the wafer box via the first circulation passage and introduce the gas into the wafer box via the second circulation passage, to drive the gas in the wafer box to circulate.

18. The system for monitoring pollution of wafer according to claim 1, wherein:

the wafer box defines an open, the wafer box further comprises a moveable door, and the moveable door is arranged in the open;

the wafer box away from the moveable door, and the installing member covers the wafer box at the surface of the wafer box away from the moveable door.

* * * * *